United States Patent
Shimizu

(10) Patent No.: US 8,259,447 B2
(45) Date of Patent: Sep. 4, 2012

(54) DISPLAY APPARATUS AND ADJUSTMENT MECHANISM

(75) Inventor: Nobuyoshi Shimizu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 221 days.

(21) Appl. No.: 12/756,805

(22) Filed: Apr. 8, 2010

(65) Prior Publication Data

US 2010/0271776 A1 Oct. 28, 2010

(30) Foreign Application Priority Data

Apr. 27, 2009 (JP) ................................. 2009-108462

(51) Int. Cl.
*H05K 7/20* (2006.01)
(52) U.S. Cl. .......................... 361/690; 361/688; 361/704
(58) Field of Classification Search .................. None
See application file for complete search history.

(56) References Cited

U.S. PATENT DOCUMENTS

| | | | | |
|---|---|---|---|---|
| 4,980,848 | A * | 12/1990 | Griffin et al. ............ | 361/679.26 |
| 5,313,362 | A * | 5/1994 | Hatada et al. ................. | 361/709 |
| 5,774,333 | A * | 6/1998 | Janik et al. ............... | 361/679.26 |
| 5,953,206 | A * | 9/1999 | Jondrow .................... | 361/679.26 |
| 5,982,617 | A * | 11/1999 | Haley et al. .............. | 361/679.26 |
| 6,243,261 | B1 * | 6/2001 | Janik et al. ............... | 361/679.46 |
| 6,297,956 | B1 * | 10/2001 | Janik et al. ............... | 361/679.47 |
| 6,366,832 | B2 * | 4/2002 | Lomonaco et al. ........... | 700/276 |
| 2004/0001310 | A1 * | 1/2004 | Chu et al. ...................... | 361/687 |
| 2011/0001898 | A1 * | 1/2011 | Mikubo et al. .................. | 349/58 |

FOREIGN PATENT DOCUMENTS

| | | |
|---|---|---|
| CN | 101036082 A | 9/2007 |
| JP | 06-281905 | 10/1994 |
| JP | 2002-311416 | 10/2002 |
| JP | 2007-134825 | 5/2007 |

OTHER PUBLICATIONS

The above CN reference was cited in a Feb. 16, 2012 Chinese Office Action, which is enclosed with an English Translation, that issued in Chinese Patent Application No. 201010159103.4.

* cited by examiner

*Primary Examiner* — Gregory Thompson
(74) *Attorney, Agent, or Firm* — Cowan, Liebowitz & Latman, P.C.

(57) ABSTRACT

The present invention provides a display apparatus including a display panel, and a plurality of adjustment mechanisms respectively arranged for a plurality of areas on a rear surface of the display panel and configured to adjust a temperature of the display panel for each of the areas, each of the plurality of adjustment mechanisms including a heat radiating unit mounted on a rear surface of the display panel and configured to form a gas flow passage on the rear surface of the display panel, and a changing unit configured to change a flow rate of a gas flowing into the gas flow passage in accordance with a temperature of an area on the rear surface of the display panel which corresponds to the heat radiating unit.

12 Claims, 10 Drawing Sheets

F I G. 4A
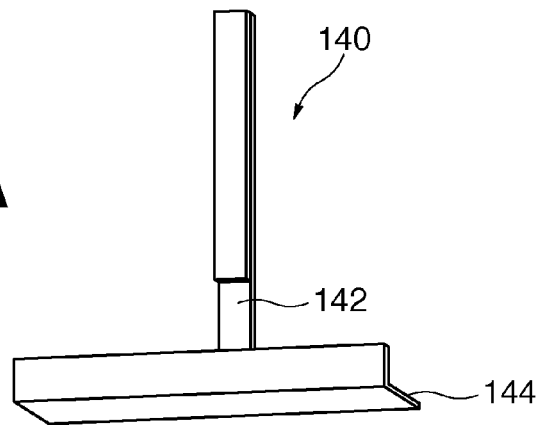
F I G. 4B
F I G. 4C
F I G. 4D
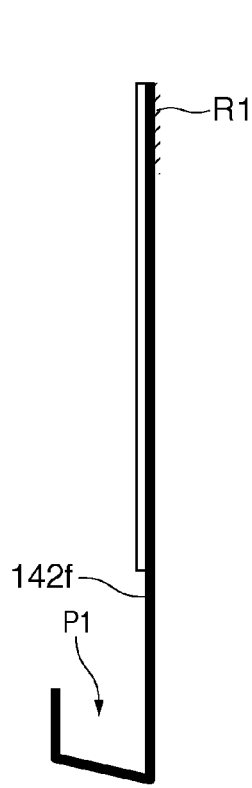
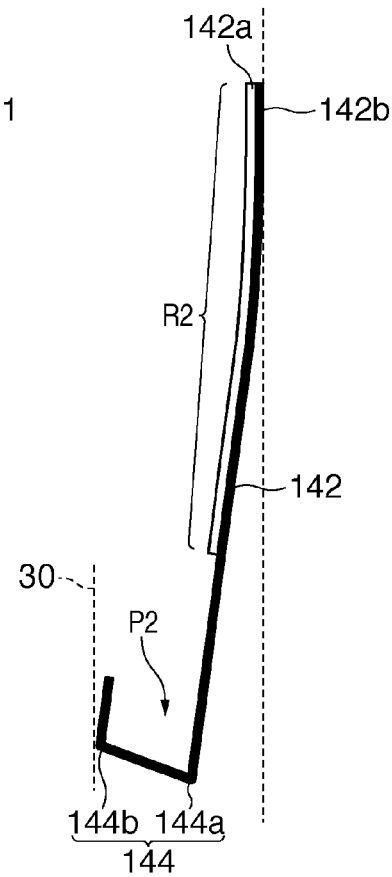
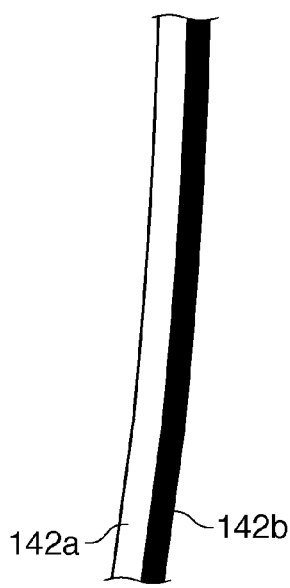

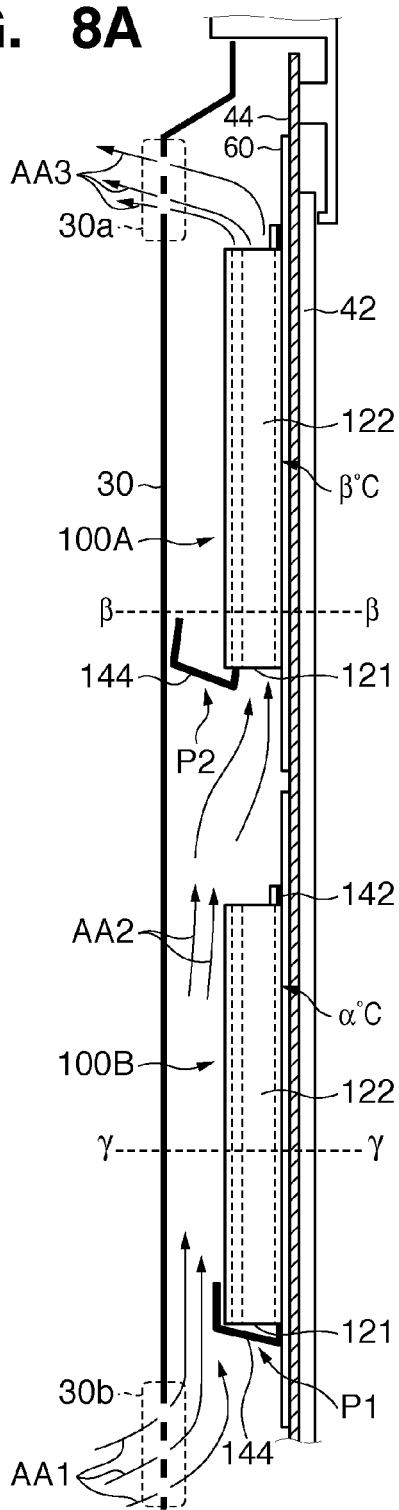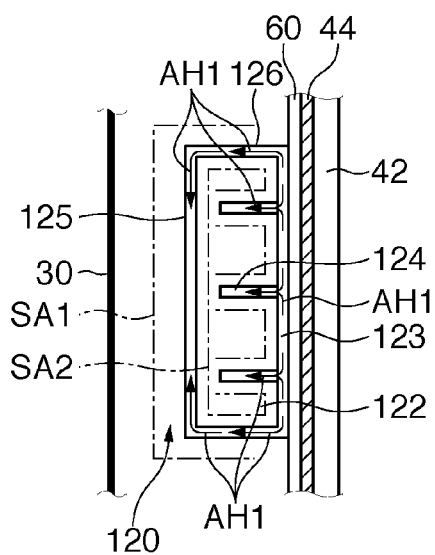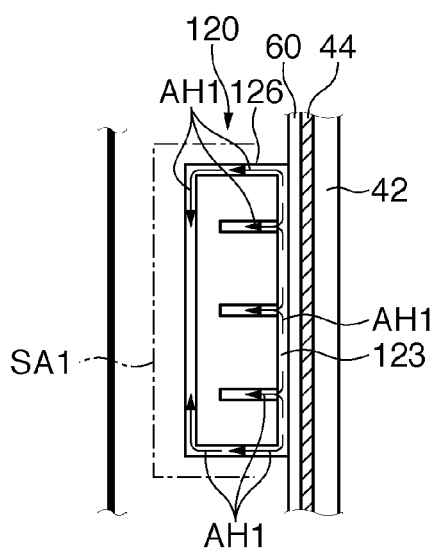

DISPLAY APPARATUS AND ADJUSTMENT MECHANISM

BACKGROUND OF THE INVENTION

1. Field of the Invention

The present invention relates to a display apparatus and an adjustment mechanism.

2. Description of the Related Art

Recently, display apparatuses such as self-luminous type display apparatuses, for example, plasma display apparatuses, and backlight type liquid crystal display apparatuses having light sources divisionally provided for the respective areas have been in widespread use. In a liquid crystal display apparatus, since the backlight emits light with uniform luminance and generates heat uniformly, exterior parts and the like covering the liquid crystal panel absorb heat near the peripheral portion of the liquid crystal panel. Therefore, the temperature of the peripheral portion of the liquid crystal panel becomes lower than that of the central portion, resulting in the occurrence of temperature irregularity (temperature distribution) inside the liquid crystal panel. Note that since the liquid crystal forming the liquid crystal panel changes in response speed with changes in temperature, image quality deteriorates due to color irregularity caused by temperature irregularity in the liquid crystal panel.

A technique for homogenizing the temperature in a liquid crystal panel has therefore been proposed in Japanese Patent Laid-Open No. 6-281905. Japanese Patent Laid-Open No. 6-281905 discloses a structure which includes a flat cooling passage between a liquid crystal panel and an incident-side polarizing plate to form an airflow rate distribution such that the airflow rate at the middle portion becomes maximum and the airflow rate at the two side portions becomes minimum in the widthwise direction of the cooling passage.

Liquid crystal panels decrease in response speed with decreases in temperature. In order to solve this problem, Japanese Patent Laid-Open No. 2002-311416 has proposed a liquid crystal display apparatus that measures (monitors) the temperature of the liquid crystal panel and controls the driving of a cooling fan or backlight in accordance with the temperature. Japanese Patent Laid-Open No. 2002-311416 discloses a technique to raise the temperature of the liquid crystal panel by increasing the current in the backlight if the temperature of the liquid crystal panel is low, and to lower the temperature of the liquid crystal panel by cooling it with a cooling fan if the temperature of the liquid crystal panel is high.

On the other hand, there is known a technique of uniformly cooling the overall liquid crystal panel of a self-luminous type display apparatus including no backlight.

According to Japanese Patent Laid-Open No. 6-281905, however, in a self-luminous type display apparatus or a backlight type liquid crystal display apparatus having light sources divisionally provided for the respective areas, it is very difficult to sufficiently homogenize the temperature of the display panel (for example, maintain the temperature of the display panel within an allowable range). In a display panel, the amounts of heat generated differ in the respective areas in accordance with the image displayed on the display panel. According to Japanese Patent Laid-Open No. 6-281905, however, the airflow rate distribution formed in the cooling passage remains unchanged (that is, the airflow rate distribution is constant in spite of the fact that the amount of heat generated in the display panel varies for each area). In Japanese Patent Laid-Open No. 6-281905, therefore, it is likely that an optimal airflow rate distribution is not formed for the generation of heat in the display panel.

In Japanese Patent Laid-Open No. 2002-311416, when the temperature of the display panel changes (in order to homogenize the temperature of the display panel), since the luminance of the backlight changes, the image (image quality) displayed on the display panel may deteriorate.

SUMMARY OF THE INVENTION

The present invention provides a technique that can reduce deterioration in image quality due to temperature irregularity in a display panel by uniformly adjusting the temperature of the display panel.

According to one aspect of the present invention, there is provided a display apparatus including a display panel, and a plurality of adjustment mechanisms respectively arranged for a plurality of areas on a rear surface of the display panel and configured to adjust a temperature of the display panel for each of the areas, each of the plurality of adjustment mechanisms including a heat radiating unit mounted on the rear surface of the display panel and configured to form a gas flow passage including openings in a vertical direction, and a changing unit configured to change a flow rate of a gas flowing into the gas flow passage through the lower opening by moving an airflow guide plate between a first position to shut the gas flow passage and a second position to open the gas flow passage in a lower portion of the heat radiating unit, wherein the changing unit increases the flow rate of the gas flowing into the flow passage through the lower opening by moving the airflow guide plate from the first position to the second position when a temperature of an area on the rear surface of the display panel which corresponds to the heat radiating unit becomes not less than a predetermined value.

Further aspects of the present invention will become apparent from the following description of exemplary embodiments with reference to the attached drawings.

BRIEF DESCRIPTION OF THE DRAWINGS

FIGS. 4A to 4D are schematic views showing a gas flow rate changing unit as one of the constituent elements of the adjustment mechanism in the display apparatus shown in FIG. 1.

FIGS. 8A to 8C are sectional views of the display apparatus shown in FIG. 5.

DESCRIPTION OF THE EMBODIMENTS

Figure 1:
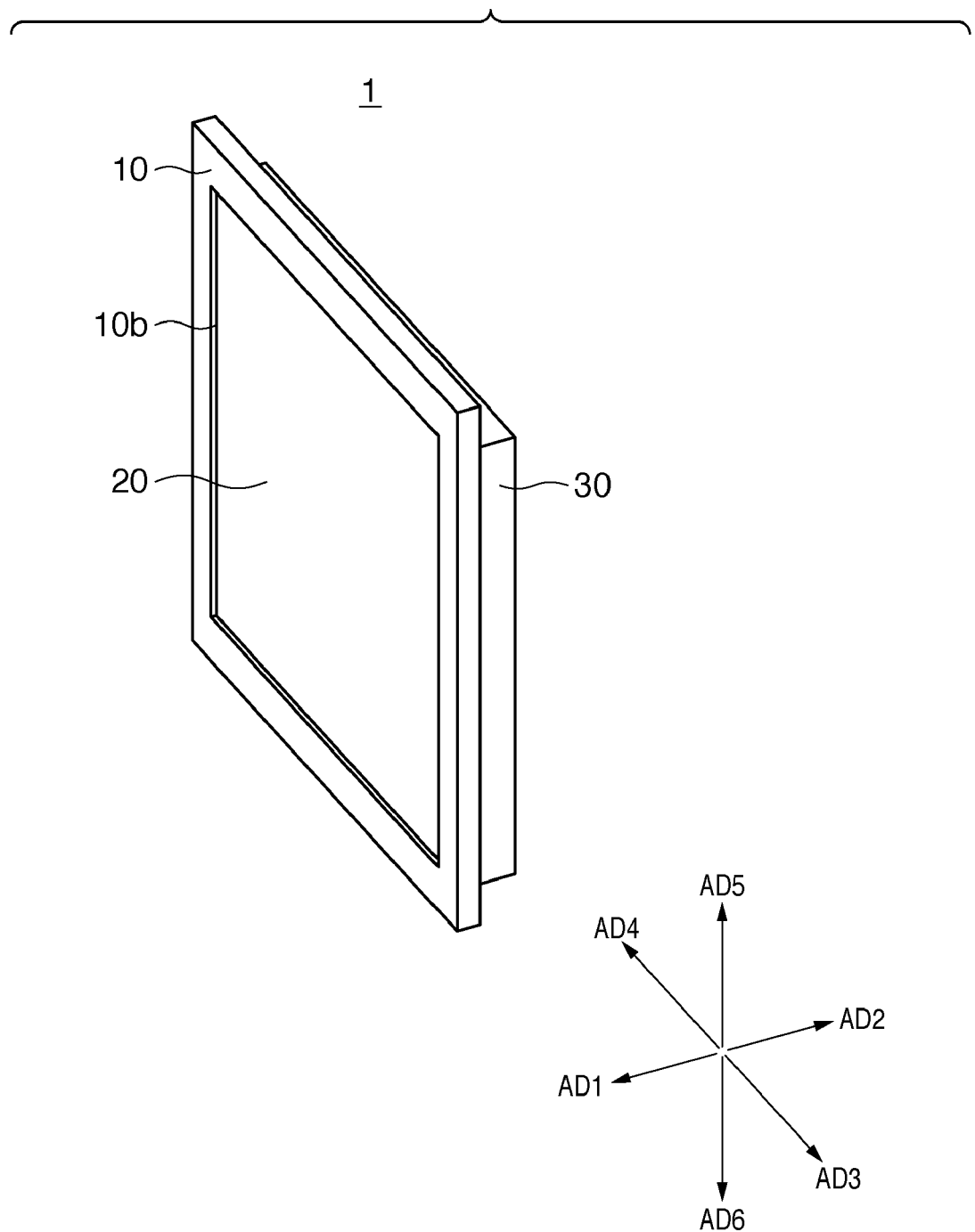
FIG. 1 is a perspective view showing the outer appearance of a display apparatus according to an aspect of the present invention.

Preferred embodiments of the present invention will be described below with reference to the accompanying drawings. Note that the same reference numerals denote the same members throughout the drawings, and a repetitive description thereof will not be given.

First Embodiment

Figure 2:
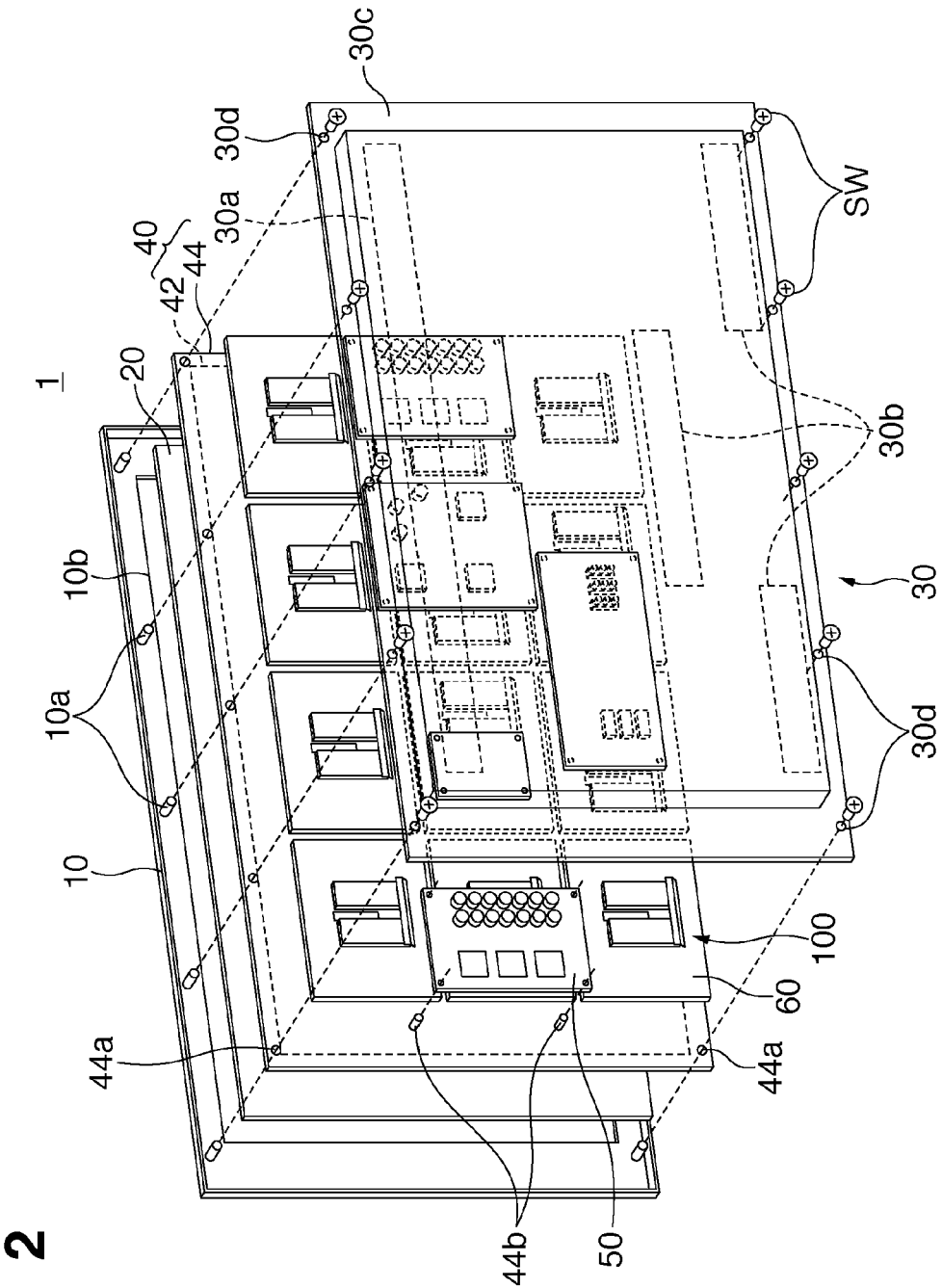
FIG. 2 is an exploded perspective view of the display apparatus shown in FIG. 1 when viewed from the rear surface side.

A display apparatus 1 according to an aspect of the present invention will be described with reference to FIGS. 1 and 2. The display apparatus 1 is an image display apparatus designed to display images. In this embodiment, this apparatus includes a bezel 10, a front plate 20, and a rear cover 30 which constitute the outer appearance of the apparatus. Note that in the following description, as shown in FIG. 1, regarding the display apparatus 1, the direction indicated by an arrow AD1 is defined as the front surface side or front surface direction, and the direction indicated by an arrow AD2, as the rear surface side or rear surface direction. In addition, regarding the display apparatus 1, the direction indicated by an arrow AD3 (the rightward horizontal direction when viewed from the user side) is defined as the rightward direction, the direction indicated by an arrow AD4 (the leftward horizontal direction when viewed from the user side), as the leftward direction, the direction indicated by an arrow AD5, as the upward direction, and the direction indicated by an arrow AD6, as the downward direction.

The bezel 10 is an exterior member on the front surface side of the display apparatus 1. For example, the bezel 10 is a member that is resin-molded and has high design quality. The inside of the bezel 10 has a plurality of bosses 10a for fixing a structure. The central portion of the bezel 10 has an opening portion 10b for displaying an image.

The front plate 20 is a plate glass on which an optical film having undergone antireflection treatment, antifouling treatment, antistatic treatment, and the like is bonded. This plate has a function of protecting a panel module 40 (preventing the panel module 40 from, for example, being damaged).

The rear cover 30 is an exterior member covering the rear surface of a display panel 42 with a space being secured between the rear cover and the rear surface of the display panel 42. The rear cover 30 prevents the live part (the part of the display apparatus 1 which is energized when it is driven) of an electrical circuit board 50 mounted inside the display apparatus 1 from being exposed.

The rear cover 30 is, for example, a metal sheet formed by drawing using a mold or the like. The rear cover 30 has desired concavo-convex shapes and an air outlet 30a and air inlets 30b including a plurality of openings (for example, small round holes) for the escape of heat inside the cover. When the display apparatus 1 is driven, the display panel 42 generates heat to warm the gas (air) inside the display apparatus 1. This gas then produces buoyancy to become an ascending current. The warmed gas is then discharged from the air outlet 30a, and an external gas (an unwarmed gas, for example, a cool gas) is taken in from the air inlets 30b.

The rear cover 30 has, on its peripheral portion, a peripheral flange 30c for fixing the rear cover 30 to the bezel 10. Note that the peripheral flange 30c has a plurality of openings 30d in which screws SW are inserted. In this embodiment, a panel chassis 44 is held between the peripheral flange 30c and the bezel 10 by inserting the screws SW into the openings 30d of the peripheral flange 30c, openings 44a of the panel chassis 44, and the bosses 10a of the bezel 10. This fixes the bezel 10, the panel module 40 (the panel chassis 44), and the rear cover 30 to each other. Although general steel cross-recessed head screws are used as the screws SW in this embodiment, it is possible to use any kinds of screws known by those skilled in the art, for example, hexagon recessed head screws or square recessed head screws.

The panel module 40 includes, for example, the display panel 42 and the panel chassis 44, and displays images such as those in TV programs. In this embodiment, the display panel 42 is formed by arranging electron emission elements on the insides of two glass plates facing each other. Note that the display panel 42 is not limited to an arrangement including electron emission elements, but it is possible to use a display panel such as a plasma display panel, organic EL display panel, and LED backlight liquid crystal display panel. The panel chassis 44 is made of a metal having high thermal conductivity such as iron or aluminum, and has a flat shape. The display panel 42 is fixed (bonded) to the front surface of the panel chassis 44 through a silicone paste that contains metal particles with high thermal conductivity and has fluidity. The plurality of openings 44a in which the screws SW are inserted are formed in the peripheral portion of the panel chassis 44. The rear surface of the panel chassis 44 is provided with a plurality of board fixing bosses 44b for mounting the electrical circuit board 50. Assume that in this embodiment, the board fixing bosses 44b have female threads.

The arrangement and operation of the display panel 42 will be described in detail below. The space between the two glass plates constituting the display panel 42 is maintained in a vacuum state. Electron emission elements connected to X- and Y-direction interconnections are arranged on the surface of the rear-surface side glass plate (the surface on the other glass plate side, for example, the surface on the front surface side). A phosphor film is formed on the surface of the front-surface side glass plate (the surface of the rear surface side). A metal back film is formed on the surface of the phosphor film on the rear surface side.

Applying a voltage of several ten V between the X-direction interconnections and the Y-direction interconnections will make the electron emission elements emit electrons. In addition, applying a voltage of several ten kV (positive potential) from an external high voltage power supply to the metal back film will accelerate the electrons emitted from the electron emission elements. When the accelerated electrons collide with the phosphor film, the phosphor film emits light. In this case, since a large current flows in the metal back film, high-temperature heat is generated. Consider, therefore, the display panel 42 as a heat generating member which generates heat when the display apparatus 1 is driven in this embodiment. Depending on the image (content) displayed on the display panel 42, areas having high luminance (for example, white areas) and areas having low luminance (for example, gray or black areas) appear on the display panel 42. The temperature of the display panel 42 is high in each high-luminance area and low in each low-luminance area. As a consequence, temperature irregularity (temperature distribution) occurs on the display panel 42.

The electrical circuit board 50 is a circuit board for displaying images, such as a drive power supply board, control board, drive board, or tuner board (for example, an electrical circuit board having an electrical circuit for driving the display apparatus 1). The electrical circuit board 50 is fixed to the board fixing bosses 44b of the panel chassis 44 with screws.

A temperature uniforming member 60 is a sheet-like member for promoting to uniform of the temperature of the display panel 42, and is made of a material having high thermal conductivity (for example, aluminum or graphite). The temperature uniforming member 60 is fixed (bonded) to the rear surface of the panel chassis 44 through a silicone paste that contains metal particles with high thermal conductivity and has fluidity. The temperature uniforming member 60 has a plurality of openings through which the board fixing bosses 44b of the panel chassis 44 extend.

Figure 3A:
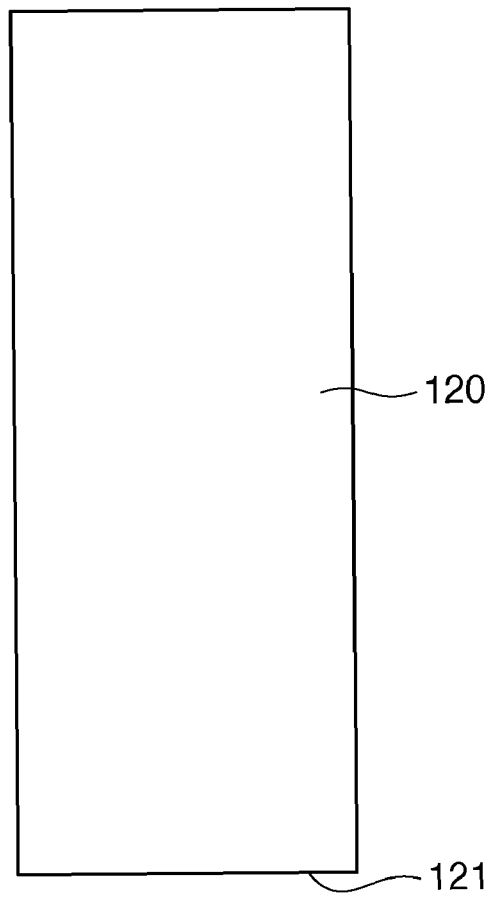
FIGS. 3A to 3C are schematic views showing a heat sink as one of the constituent elements of an adjustment mechanism in the display apparatus shown in FIG. 1.
Figure 3B:
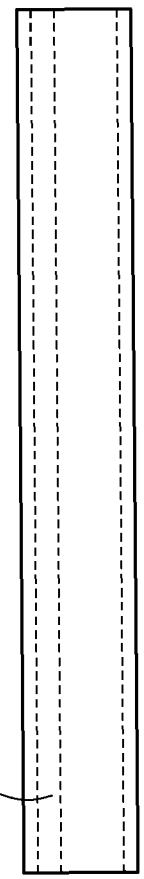
Figure 3C:
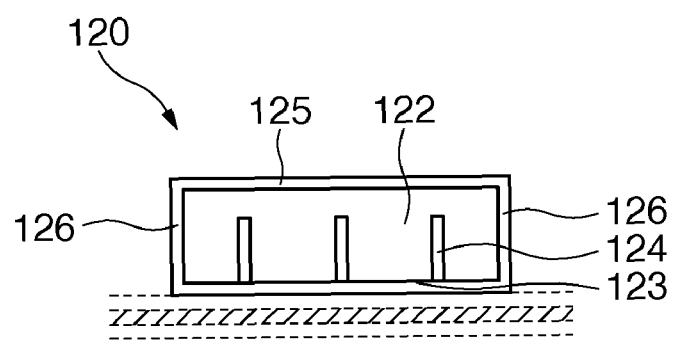

Adjustment mechanisms 100 are mechanisms which are arranged in correspondence with a plurality of areas on the rear surface of the display panel 42 to adjust the temperature of the display panel 42 for the respective areas. In this embodiment, these mechanisms are fixed to the rear surface of the temperature uniforming member 60. As shown in FIGS. 3A to 3C and 4A to 4D, the adjustment mechanisms 100 each include a heat sink 120 and a gas flow rate changing unit 140. FIG. 3A is a rear view of the heat sink 120. FIG. 3B is a side view of the heat sink 120. FIG. 3C is a bottom view of the heat sink 120. FIG. 4A is a perspective view of the gas flow rate changing unit 140. FIGS. 4B and 4C are side views of the gas flow rate changing unit 140. FIG. 4D is a partial enlarged view of the gas flow rate changing unit 140.

The heat sink 120 is a heat radiating member made of a material having high thermal conductivity (for example, a metal such as aluminum), and is mounted on the rear surface of the display panel 42 through the temperature uniforming member 60. Note that the heat sink 120 is fixed (bonded) to the rear surface of the temperature uniforming member 60 through a silicone paste that contains metal particles with high thermal conductivity and has fluidity.

In this embodiment, the heat sink 120 forms a gas flow passage (hollow portion) 122 having an almost quadratic prism shape and two openings in the vertical direction (the lower opening is an opening 121). It is possible to make a gas (air) inside the display apparatus 1 flow into the gas flow passage 122 through the opening 121. The heat sink 120 also has a plurality of fins (heat radiating plates) 124 formed on an inner surface 123 on the rear surface side of the display panel 42 (the mount surface (for the temperature uniforming member 60) of the display panel 42) so as to project into the gas flow passage 122. The plurality of fins 124 are provided on the inner surface 123 at predetermined intervals so as to be vertical to the inner surface 123 and not to be in contact with a rear surface (the surface on the rear surface side) 125. This makes heat from the display panel 42 sequentially conduct to the inner surface 123 and the fins 124. As a result, most of the heat conducts to the gas inside the gas flow passage 122 instead of the rear surface 125. Surfaces of the heat sink 120 in the leftward and rightward directions are defined as side surfaces 126 hereinafter.

In this embodiment, each gas flow rate changing unit 140 includes an adjustment plate 142 and an airflow guide plate 144. The gas flow rate changing unit 140 changes the flow rate of the gas flowing into the gas flow passage 122 through the opening 121 by moving the airflow guide plate 144 under the heat sink 120. For example, the gas flow rate changing unit 140 moves the airflow guide plate 144 between the first position where the gas flow passage 122 is shut (for example, the opening 121 is closed) and the second position where the gas flow passage 122 is opened (for example, the opening 121 is opened). As the temperature of the corresponding area on the rear surface of the display panel 42 rises, the gas flow rate changing unit 140 moves the airflow guide plate 144 closer to the second position to increase the flow rate of the gas flowing into the gas flow passage 122 through the opening 121.

The adjustment plate 142 includes a first plate member 142a and a second plate member 142b which have different linear expansion coefficients and are in tight contact with each other. Note that the adjustment plate 142 is fixed (bonded) to the rear surface of the temperature uniforming member 60 through a silicone paste that contains metal particles with high thermal conductivity and has fluidity in an area (a range of several mm from the other end of a first bent portion 144a) R1 at one end of the second plate member 142b.

The first plate member 142a is a metal sheet made of a metal having low linear expansion coefficient (low expansion coefficient), which has a predetermined thickness, width, and length. The second plate member 142b is a metal sheet made of a material which is different from that for the first plate member 142a and has a higher linear expansion coefficient (higher expansion coefficient) than the first plate member 142a. For example, as shown in FIG. 4A, the second plate member 142b has an almost T shape. The first and second plate members 142a and 142b have almost the same shape at a stem portion 142f in an almost T shape, and are in tight contact with each other by soldering or welding. In this embodiment, the second plate member 142b includes a first bent portion 144a and a second bent portion 144b formed by bending an upper side portion in an almost T shape twice. The flat surface portion between the first bent portion 144a and the second bent portion 144b forms the airflow guide plate 144. As described above, in this embodiment, the adjustment plate 142 and the airflow guide plate 144 are integrally formed. However, the adjustment plate 142 and the airflow guide plate 144 may be formed as discrete components, and the airflow guide plate 144 may be connected to the adjustment plate 142.

As described above, the first plate member 142a and the second plate member 142b have different linear expansion coefficients, and hence differ in the amount of deformation due to the heat transferred from the display panel 42. As a consequence, the adjustment plate 142 curves in accordance with the temperature of the corresponding area on the rear surface of the display panel 42 in an area R2 where the first and second plate members 142a and 142b are in tight contact with each other. This can move the airflow guide plate 144.

Consider, for example, a case in which the temperature of the corresponding area on the rear surface of the display panel 42 is equal to or lower than the first temperature (equal to or lower than α° C.). In this case, as shown in FIG. 4B, the adjustment plate 142 moves the airflow guide plate 144 so as not to make a gas flow into the gas flow passage 122 through the lower opening 121. More specifically, the adjustment plate 142 moves the airflow guide plate 144 to a first position P1 where the gas flow passage 122 is shut. In this case, the airflow guide plate 144 comes into contact with the rear surface (the temperature uniforming member 60) of the display panel 42. Note that it is when the display panel 42 displays an image with low luminance for a predetermined period of time that the temperature of the corresponding area on the rear surface of the display panel 42 becomes equal to or lower than the first temperature.

Consider a case in which the temperature of the corresponding area on the rear surface of the display panel 42 is equal to or higher than the second temperature (equal to or higher than β° C.) higher than the first temperature (α° C.). In this case, as shown in FIG. 4C, the adjustment plate 142 moves the airflow guide plate 144 so as to make a gas flow into the gas flow passage 122 through the lower opening 121. More specifically, the adjustment plate 142 moves the airflow guide plate 144 to a second position P2 where the gas flow passage 122 is opened. In this case, the airflow guide plate 144 comes into contact with the inner surface of the rear cover 30. Note that it is when the display panel 42 displays an image with high luminance for a predetermined period of time that the temperature of the corresponding area on the rear surface of the display panel 42 becomes equal to or higher than the second temperature.

In addition, if the temperature of the corresponding area on the rear surface of the display panel 42 is a temperature between the first temperature ($\alpha°$ C.) and the second temperature ($\beta°$ C.), the adjustment plate 142 moves the airflow guide plate 144 to a position between the first position P1 and the second position P2.

Figure 5:
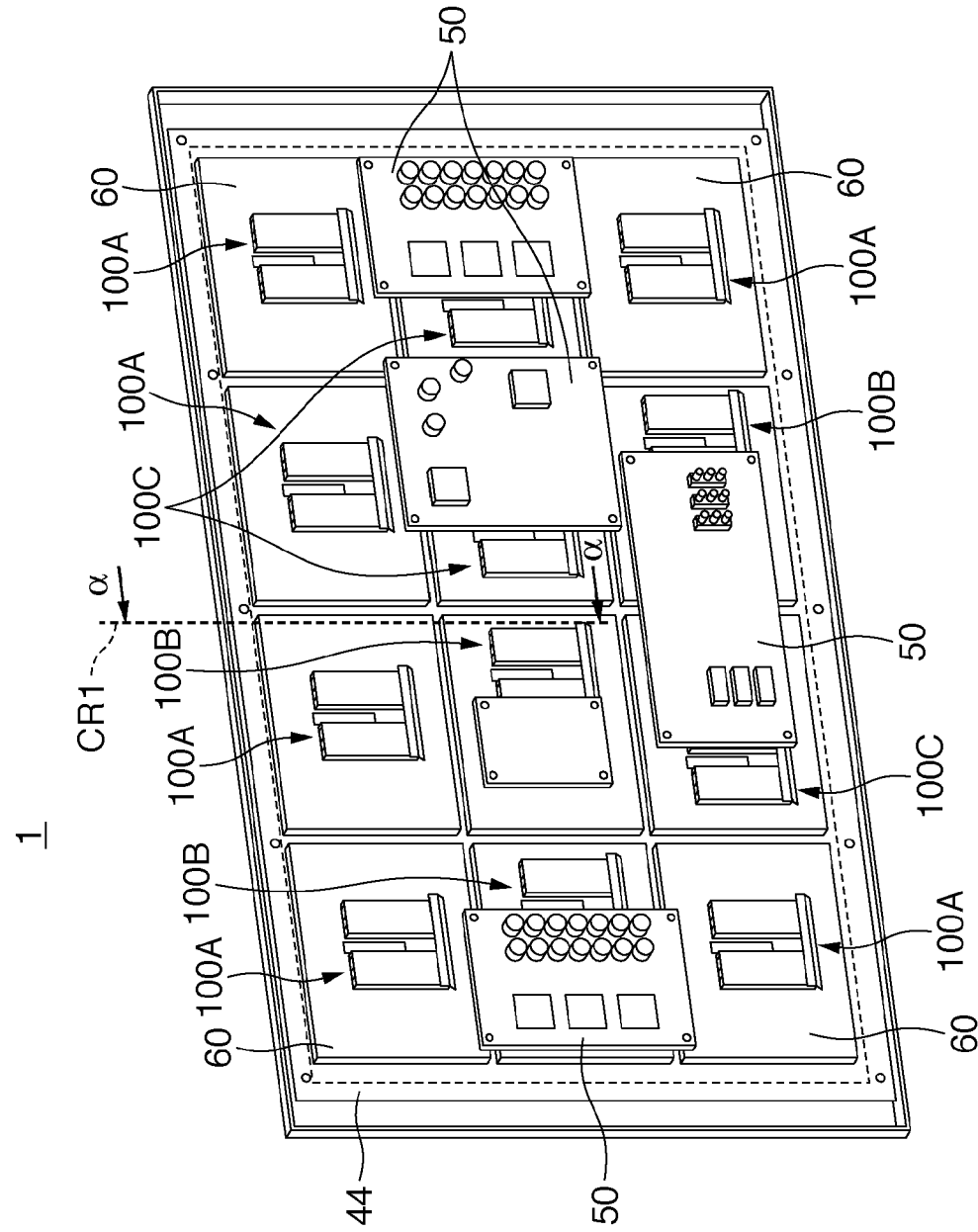
FIG. 5 is a perspective view of the display apparatus shown in FIG. 1 when viewed from the rear surface side.
Figure 6A:
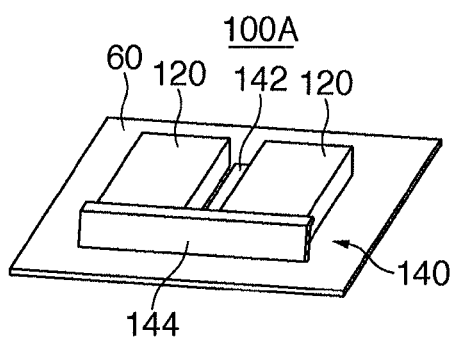
FIGS. 6A to 6D are views for explaining the positional relationship between the heat sink and the gas flow rate changing unit (an adjustment plate and an airflow guide plate) constituting the adjustment mechanism in the display apparatus shown in FIG. 1.
Figure 6C:
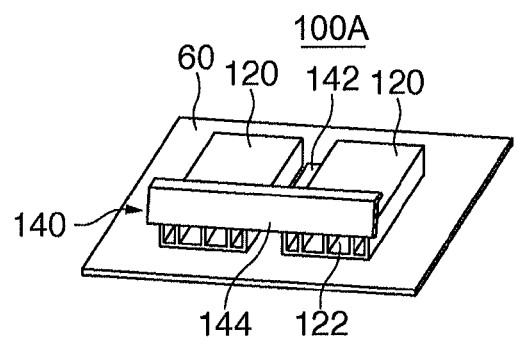
Figure 6B:
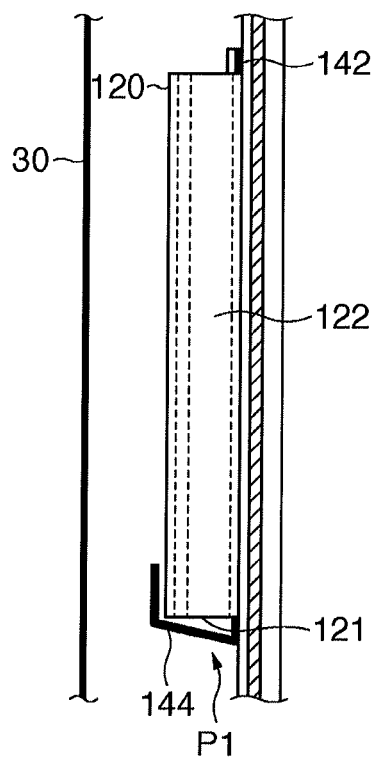
Figure 6D:
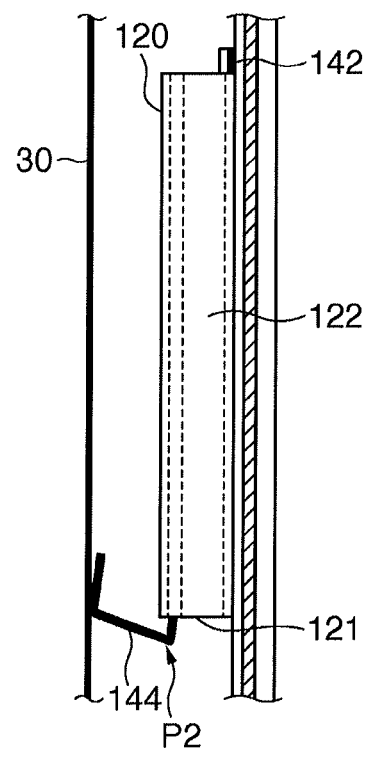
Figure 7A:
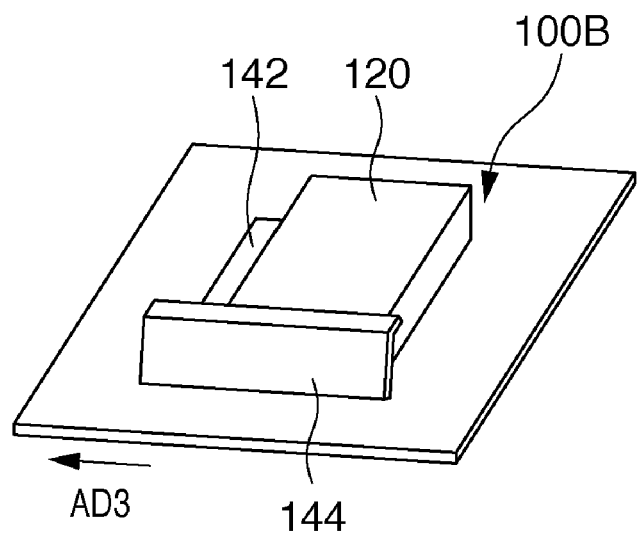
FIGS. 7A and 7B are downward perspective views of the adjustment mechanism of the display apparatus shown in FIG. 1.
Figure 7B:
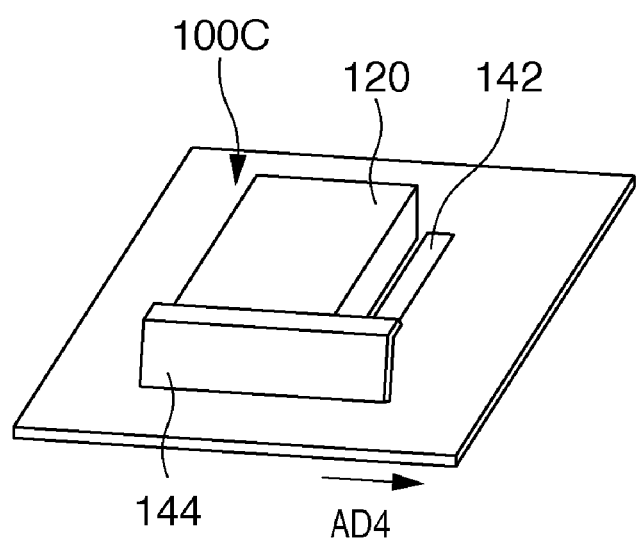

The positional relationship between the heat sink 120 and the gas flow rate changing unit 140 (the adjustment plate 142 and the airflow guide plate 144) constituting the adjustment mechanism 100 will be described with reference to FIGS. 5, 6A to 6D, 7A, and 7B. Assume that in the following description, the adjustment mechanism 100 including two heat sinks 120 is defined as an adjustment mechanism 100A, and the adjustment mechanism 100 including one heat sink 120 is defined as an adjustment mechanism 100B or adjustment mechanism 100C. FIG. 5 is a perspective view showing the display apparatus 1 when viewed from the rear surface side. FIGS. 6A and 6B are a downward perspective view and a side view, respectively, showing a state in which the adjustment plate 142 has moved the airflow guide plate 144 to the first position P1 in the adjustment mechanism 100A. FIGS. 6C and 6D are a downward perspective view and a side view, respectively, showing a state in which the adjustment plate 142 has moved the airflow guide plate 144 to the second position P2 in the adjustment mechanism 100A. FIGS. 7A and 7B are downward perspective views of the adjustment mechanism 100B and adjustment mechanism 100C, respectively.

The adjustment mechanism 100A has the gas flow rate changing unit 140 disposed between the two heat sinks 120. More specifically, in the gas flow rate changing unit 140, the adjustment plate 142 is positioned between the two heat sinks 120, and the airflow guide plate 144 is positioned near the lower openings 121 of the two heat sinks 120. When, therefore, the airflow guide plate 144 is located at the first position P1, the gas flow passages 122 of the two heat sinks 120 are shut, as shown in FIGS. 6A and 6B. When the airflow guide plate 144 is located at the second position P2, the gas flow passages 122 of the two heat sinks 120 are open, as shown in FIGS. 6C and 6D.

As shown in FIG. 5, since the plurality of electrical circuit boards 50 are fixed on the rear surface of the panel chassis 44, it is sometimes impossible to secure a space for mounting the adjustment mechanism 100A including the two heat sinks 120. In this case, as shown in FIGS. 5, 7A, and 7B, the adjustment mechanism 100B or 100C having one heat sink 120 may be disposed.

As shown in FIG. 7A, the adjustment mechanism 100B is configured such that the adjustment plate 142 is disposed in the direction indicated by the arrow AD3 relative to the heat sink 120, and one end of the airflow guide plate 144 is connected to the adjustment plate 142 (for example, the airflow guide plate 144 does not exist in the direction indicated by the arrow AD3 from the adjustment plate 142). As shown in FIG. 7B, the adjustment mechanism 100C is configured such that the adjustment plate 142 is disposed in the direction indicated by the arrow AD4 relative to the heat sink 120, and one end of the airflow guide plate 144 is connected to the adjustment plate 142 (for example, the airflow guide plate 144 does not exist in the direction indicated by the arrow AD4 from the adjustment plate 142). When the airflow guide plate 144 is located at the first position P1 in the adjustment mechanism 100B or 100C, the gas flow passage 122 of the one heat sink 120 is shut. When the airflow guide plate 144 is located at the second position P2, the gas flow passage 122 of the one heat sink 120 is opened.

The flow of the gas and the transfer of heat inside the display apparatus 1 in a case in which an arbitrary image is displayed on the display panel 42 (the display apparatus 1 is operating) will be described next with reference to FIGS. 8A to 8C. FIG. 8A is a sectional view taken along a line $\alpha$-$\alpha$ of the display apparatus 1 shown in FIG. 5. FIG. 8B is a sectional view taken along a line $\beta$-$\beta$ of the display apparatus 1 shown in FIG. 8A. FIG. 8C is a sectional view taken along a line $\gamma$-$\gamma$ of the display apparatus 1 shown in FIG. 8A.

As shown in FIG. 8A, the adjustment mechanisms 100A and 100B are respectively located at upper and lower positions. In the adjustment mechanism 100A, the airflow guide plate 144 is located at the second position P2. In the adjustment mechanism 100B, the airflow guide plate 144 is located at the first position P1.

An external gas (cool gas) flows into the inside of the display apparatus 1 (the space between the panel chassis 44 and the rear cover 30) through the air inlets 30b of the rear cover 30, as indicated by an arrow AA1. Heat from the display panel 42 as a heat source conducts to the gas flowing into the display apparatus 1 (for example, the gas is warmed up by absorbing heat). As a consequence, the gas becomes an ascending current, as indicated an arrow AA2. The gas flowing into the display apparatus 1 is discharged from the air outlet 30a of the rear cover 30, as indicated by an arrow AA3.

Assume that the temperature of the corresponding area on the rear surface of the display panel 42 in the adjustment mechanism 100A is the second temperature ($\beta°$ C.), and the temperature of the corresponding area on the rear surface of the display panel 42 in the adjustment mechanism 100B is the first temperature ($\alpha°$ C.).

As shown in FIG. 8B, in the adjustment mechanism 100A, to move the airflow guide plate 144 to the second position P2, the adjustment plate 142 opens the gas flow passage 122. As a result, a gas flows into the gas flow passage 122 through the lower opening 121. Note that since the airflow guide plate 144 is in contact with the inner surface of the rear cover 30, the gas flow passage between the rear cover 30 and the heat sink 120 is shut. The heat transferred from the display panel 42 through the temperature uniforming member 60 is transferred to the overall heat sink 120 (including the fins 124), as indicated by arrows AH1. The heat transferred to the overall heat sink 120 is then transferred from a surface SA1 of the heat sink 120 and a surface SA2 of the gas flow passage 122 (fins 124) to the surrounding gas. Opening the gas flow passage 122 of the heat sink 120 in this manner will increase the area of contact between the heat sink 120 and the gas (the area of the transfer of heat). This can effectively transfer heat from the display panel 42. In other words, when the gas flow passage 122 is open, the heat radiating effect of the heat sink 120 increases to actively absorb heat from the display panel 42, thereby lowering the temperature of the display panel 42.

On the other hand, as shown in FIG. 8C, in the adjustment mechanism 100B, to move the airflow guide plate 144 to the first position P1, the adjustment plate 142 shuts the gas flow passage 122 to inhibit a gas from flowing into the gas flow passage 122 through the lower opening 121. Note that the gas flows into the space between the rear cover 30 and the heat sink 120. The heat transferred from the display panel 42 through the temperature uniforming member 60 is transferred to the overall heat sink 120 (including the fins 124), as indicated by arrows AH1. Note, however, that since the gas flow passage 122 of the heat sink 120 is shut, the heat transferred to the overall the heat sink 120 is transferred from only the surface SA1 of the heat sink 120 to the surrounding gas. Shutting the gas flow passage 122 of the heat sink 120 in this manner will decrease the area of contact between the heat sink 120 and the gas. As a result, the heat sink 120 does not greatly contribute to heat radiation. In other words, when the gas flow passage 122 is shut, the heat radiating effect of the heat sink 120 decreases. That is, the heat sink 120 does not actively absorb heat from the display panel 42, and hence the temperature of the display panel 42 does not greatly change.

Figure 9:
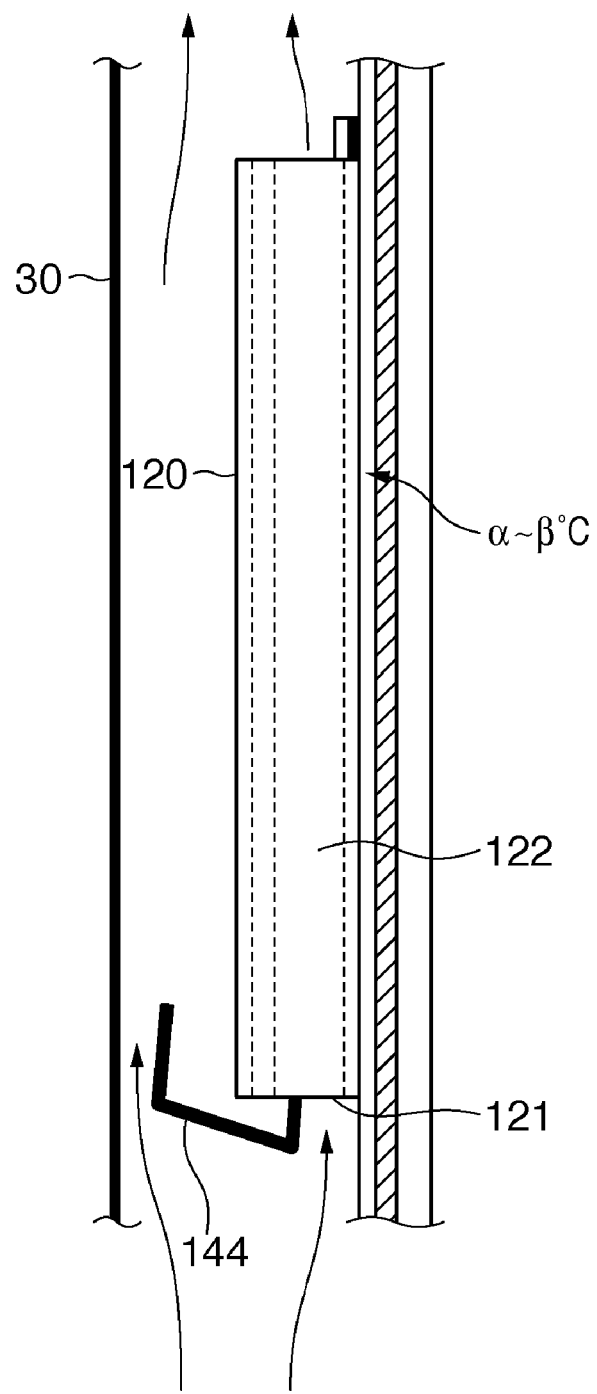
FIG. 9 is a sectional view of the display apparatus shown in FIG. 5.

When the temperature of the corresponding area on the rear surface of the display panel 42 is a temperature falling between the first temperature ($\alpha°$ C.) and the second temperature ($\beta°$ C.), the adjustment plate 142 moves the airflow guide plate 144 to a position between the first position P1 and the second position P2, as shown in FIG. 9. Therefore, part of the gas flow passage 122 and part of the space between the rear cover 30 and the heat sink 120 are opened, and a gas flows into both the gas flow passage 122 and the space between the rear cover 30 and the heat sink 120. In other words, the gas flows into the passage (the gas flow passage 122) which increases the heat radiating effect of the heat sink 120 and into the passage (the space between the rear cover 30 and the heat sink 120) which decreases the heat radiating effect of the heat sink 120. This makes the heat sink 120 have both the heat radiating effect obtained when the gas flow passage 122 is open and the heat radiating effect obtained when the gas flow passage 122 is shut.

As described above, in the display apparatus 1 according to this embodiment, the adjustment plate 142 curves in accordance with the temperature of the corresponding area on the rear surface of the display panel 42 to move the airflow guide plate 144. More specifically, as the temperature of the corresponding area on the rear surface of the display panel 42 rises, the adjustment plate 142 moves the airflow guide plate 144 closer to the position where the gas flow passage 122 of the heat sink 120 is shut opened to increase the flow rate of the gas flowing into the gas flow passage 122 through the opening 121. This increases the heat radiating effect of the heat sink 120 to lower the temperature when the temperature of the corresponding area on the rear surface of the display panel 42 is high, and decreases the heat radiating effect of the heat sink 120 to prevent the temperature from lowering when the temperature of the corresponding area on the rear surface of the display panel 42 is low. In this manner, the plurality of adjustment mechanisms 100 mounted on the rear surface of the display panel 42 each function in accordance with the temperature of a corresponding area on the rear surface of the display panel 42. This makes it possible to homogenize the temperature of the display panel 42. The display apparatus 1 can therefore reduce deterioration in image quality due to temperature irregularity in the display panel.

Second Embodiment

Figure 10A:
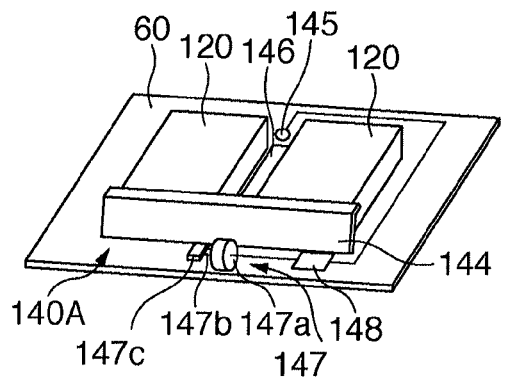
FIGS. 10A to 10D are downward perspective views and side views of the adjustment mechanism of the display apparatus shown in FIG. 1.
Figure 10C:
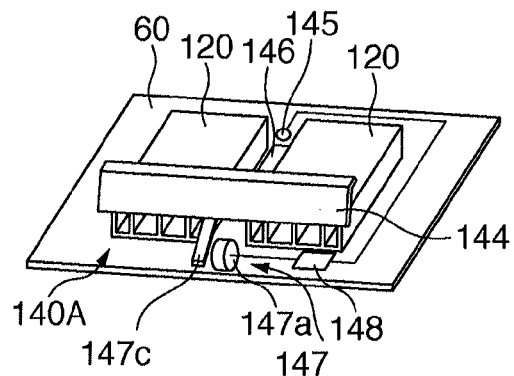
Figure 10B:
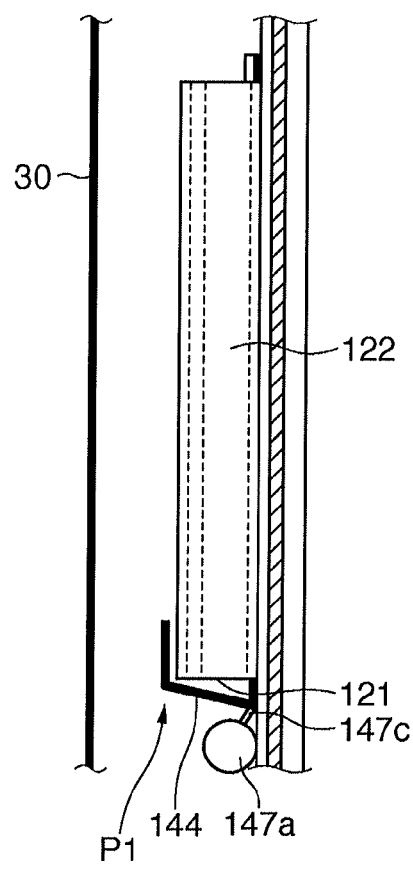
Figure 10D:
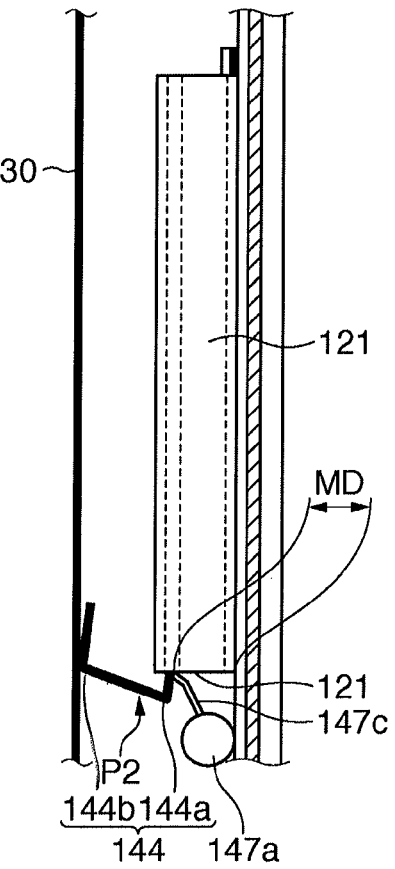

A gas flow rate changing unit 140A shown in FIGS. 10A to 10D can replace the gas flow rate changing unit 140 of the adjustment mechanism 100. In this embodiment, the gas flow rate changing unit 140A includes an airflow guide plate 144, a detection unit 145, a connecting plate 146, an actuator 147, and a control unit 148. FIGS. 10A and 10B are a downward perspective view and a side view, respectively, showing a state in which the airflow guide plate 144 is moved to a first position P1 in the adjustment mechanism 100. FIGS. 10C and 10D are a downward perspective view and a side view, respectively, showing a state in which the airflow guide plate 144 is moved to a second position P2 in the adjustment mechanism 100.

The detection unit 145 is fixed to the rear surface of a temperature uniforming member 60. The detection unit 145 detects the temperature of the corresponding area on the rear surface of the display panel 42, and also outputs the detection result (for example, the temperature of the corresponding area on the rear surface of the display panel 42) to the control unit 148.

The connecting plate 146 is a metal sheet made of a metal and has, for example, an almost T shape. In this embodiment, the connecting plate 146 includes a first bent portion 144a and a second bent portion 144b which are formed by bending the upper side portion of the almost T shape twice. The flat surface portion between the first bent portion 144a and the second bent portion 144b forms the airflow guide plate 144. In this manner, in this embodiment, the connecting plate 146 and the airflow guide plate 144 are integrally formed. However, the connecting plate 146 and the airflow guide plate 144 may be formed as discrete components, and the connecting plate 146 may be connected to the airflow guide plate 144. The connecting plate 146 is fixed (bonded) to the rear surface of the temperature uniforming member 60 through a silicone paste that contains metal particles with high thermal conductivity and has fluidity in an area (a range of several mm from the other end of the first bent portion 144a) R1 at one end of the connecting plate 146. As shown in FIG. 10B, the connecting plate 146 has an elastic force that tries to always maintain its flat shape (for example, the shape conforming to the temperature uniforming member 60).

The actuator 147 includes a stepping motor 147a, a rotating shaft 147b, and a link member 147c. The stepping motor 147a is fixed to the temperature uniforming member 60 and is controlled by the control unit 148. In this embodiment, the link member 147c is a flat metal sheet. One end of the link member 147c is connected to the rotating shaft 147b. The other end of the link member 147c comes into contact with the connecting plate 146 between the connecting plate 146 and the temperature uniforming member 60. When the stepping motor 147a of the actuator 147 rotates, the rotating force of the stepping motor 147a is transmitted to the link member 147c through the rotating shaft 147b. As shown in FIG. 10D, the link member 147c then applies force to the connecting plate 146 in the direction to separate from the temperature uniforming member 60. As a result, the connecting plate 146 curves, and hence it is possible to move the airflow guide plate 144.

The control unit 148 moves the airflow guide plate 144 by controlling the rotational angle of the stepping motor 147a based on the temperature detected by the detection unit 145 (for example, the temperature of the corresponding area on the rear surface of the display panel 42). Note that if this arrangement includes an encoder which measures the rotational angle of the stepping motor 147a, the control unit 148 controls the rotational angle of the stepping motor 147a based on the temperature detected by the detection unit 145 and the rotational angle information from the encoder.

Consider a case in which the temperature of the corresponding area on the rear surface of the display panel 42 which is detected by the detection unit 145 is equal to or lower than a first temperature (equal to or lower than $a°$ C.). In this case, the control unit 148 controls the rotational angle of the stepping motor 147a so as not to make a gas flow into a gas flow passage 122 through the lower opening 121, and moves the airflow guide plate 144 to the first position P1 to shut the gas flow passage 122, as shown in FIG. 10B. Note that in this embodiment, since the connecting plate 146 has the elastic force described above, the control unit 148 can move the airflow guide plate 144 to the first position P1 to shut the gas flow passage 122 unless rotating the stepping motor 147*a*.

Consider a case in which the temperature of the corresponding area on the rear surface of the display panel 42 which is detected by the detection unit 145 is equal to or higher than the second temperature (equal to or higher than β° C.) higher than the first temperature (α° C.). In this case, the control unit 148 controls the rotational angle of the stepping motor 147*a* so as to make a gas flow into the gas flow passage 122 through the lower opening 121, and moves the airflow guide plate 144 to the second position P2 to open the gas flow passage 122, as shown in FIG. 10D. In this case, the airflow guide plate 144 comes into contact with the inner surface of a rear cover 30.

Consider a case in which the temperature of the corresponding area on the rear surface of the display panel 42 which is detected by the detection unit 145 is a temperature falling between the first temperature (α° C.) and the second temperature (β° C.). In this case, the control unit 148 controls the rotational angle of the stepping motor 147*a* so as to make a gas flow into the gas flow passage 122 and the space between the rear cover 30 and a heat sink 120, and moves the airflow guide plate 144 to a position between the first position P1 and the second position P2. In this case, the control unit 148 controls the rotational angle of the stepping motor 147*a* so as to establish a linear relationship between a temperature between the first temperature (α° C.) and the second temperature (β° C.) and a moving distance MD of the airflow guide plate 144.

As described above, in the display apparatus 1 according to this embodiment, the actuator 147 can move the airflow guide plate 144 by curving the connecting plate 146 in accordance with the temperature of the area on the rear surface of the display panel 42 which is detected by the detection unit 145. As in the first embodiment, the display apparatus 1 can reduce deterioration in image quality due to temperature irregularity inside the display panel by uniforming the temperature of the display panel 42.

Third Embodiment

In a gas flow rate changing unit 140A, the rotational angle of a stepping motor 147*a* is controlled to move an airflow guide plate 144 based on the image data of the image displayed on a display panel 42 instead of the temperature of the corresponding area on the rear surface of the display panel 42. In this case, a control unit 148 receives the image data of the image displayed on the display panel 42, and calculates average information by averaging the luminance components of the image data in the respective areas in which a plurality of adjustment mechanisms 100 are arranged. The control unit 148 moves the airflow guide plate 144 by controlling the rotational angle of the stepping motor 147*a* based on the calculated average information.

Consider, for example, a case in which the average information calculated by the control unit 148 is equal to or less than the first value. In this embodiment, the first value corresponds the luminance component of image data with low luminance, and is equivalent to the first temperature (α° C.) when the display panel 42 displays an image with low luminance for a predetermined period of time. In this case, the control unit 148 moves the airflow guide plate 144 to a first position P1 to shut a gas flow passage 122 by controlling the rotational angle of the stepping motor 147*a* so as not to make a gas flow into the gas flow passage 122 through a lower opening 121 (see FIG. 10B).

Consider a case in which the average information calculated by the control unit 148 is equal to or more than the second value larger than the first value. Assume that in this embodiment, the second value corresponds to the luminance component of the image data with high luminance, and is equivalent to the second temperature (β° C.) when the display panel 42 displays an image with high luminance for a predetermined period of time. In this case, the control unit 148 moves the airflow guide plate 144 to a second position P2 to open the gas flow passage 122 by controlling the rotational angle of the stepping motor 147*a* so as to make a gas flow into the gas flow passage 122 through a lower opening 121 (see FIG. 10D). In this case, the airflow guide plate 144 comes into contact with the inner surface of a rear cover 30.

Consider a case in which the average information calculated by the control unit 148 is a value between the first value and the second value. In this case, the control unit 148 moves the airflow guide plate 144 to a position between the first position P1 and the second position P2 by controlling the rotational angle of the stepping motor 147*a* so as to make a gas flow into the gas flow passage 122 and the space between the rear cover 30 and a heat sink 120. In this case, the control unit 148 controls the rotational angle of the stepping motor 147*a* so as to establish a linear relationship between the value between the first value and the second value and the moving distance of the airflow guide plate 144.

As described above, in the display apparatus 1 according to this embodiment, an actuator 147 can move the airflow guide plate 144 by curving the connecting plate 146 in accordance with the image data (its luminance component) of the image displayed on the display panel 42. As in the first and second embodiments, the display apparatus 1 can reduce deterioration in image quality due to temperature irregularity inside the display panel by homogenizing the temperature of the display panel 42.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2009-108462 filed on Apr. 27, 2009, which is hereby incorporated by reference herein in its entirety.

What is claimed is:

1. A display apparatus comprising:
    a display panel; and
    a plurality of adjustment mechanisms respectively arranged for a plurality of areas on a rear surface of the display panel and configured to adjust a temperature of the display panel for each of the areas,
    each of the plurality of adjustment mechanisms including
    a heat radiating unit mounted on the rear surface of the display panel and configured to form an airflow passage including openings in a vertical direction, and
    an airflow passage changing unit configured to change a flow rate of an air flowing into the airflow passage through a lower opening by moving an airflow guide plate of the airflow passage changing unit between a first position to shut the airflow passage and a second position to open the airflow passage in a lower portion of the heat radiating unit,
    wherein the airflow passage changing unit increases the flow rate of the air flowing into the airflow passage through the lower opening by moving the airflow guide plate from a first position side to a second position side when a temperature of an area of the plurality of areas on the rear surface of the display panel which corresponds to the heat radiating unit becomes not less than a predetermined value.

2. The apparatus according to claim 1, wherein the airflow passage changing unit moves the airflow guide plate to the first position side so as not to make an airflow into the airflow passage through the lower opening when the temperature of the corresponding area on the rear surface of the display panel is not more than a first temperature, and moves the airflow guide plate to the second position side so as to make an airflow into the airflow passage through the lower opening when the temperature of the corresponding area on the rear surface of the display panel is not less than a second temperature higher than the first temperature.

3. The apparatus according to claim 2, wherein the airflow passage changing unit moves the airflow guide plate to a position between the first position and the second position when the temperature of the corresponding area on the rear surface of the display panel is a temperature falling between the first temperature and the second temperature.

4. The apparatus according to claim 1, wherein the airflow passage changing unit includes an adjustment plate which is connected to the airflow guide plate and is formed by arranging a first plate member and a second plate member having different linear expansion coefficients in tight contact with each other, and moves the airflow guide plate by curving the adjustment plate in accordance with the temperature of the corresponding area on the rear surface of the display panel.

5. The apparatus according to claim 1, wherein the airflow passage changing unit includes a detection unit configured to detect the temperature of the corresponding area on the rear surface of the display panel, and a moving unit configured to move the airflow guide plate based on the temperature detected by the detection unit.

6. The apparatus according to claim 1, wherein the airflow passage changing unit includes a calculation unit configured to calculate average information by averaging luminance components of image data of an image displayed on the display panel for each of the plurality of areas, and a moving unit configured to move the airflow guide plate based on the average information calculated by the calculation unit, and the airflow passage changing unit moves the airflow guide plate to the first position side so as not to make an airflow into the airflow passage through the lower opening when the average information calculated by the calculation unit is not more than a first value, and moves the airflow guide plate to the second position side so as to make an airflow into the airflow passage through the lower opening when the average information calculated by the calculation unit is not less than a second value larger than the first value.

7. The apparatus according to claim 6, wherein the airflow passage changing unit moves the airflow guide plate to a position between the first position and the second position when the average information calculated by the calculation unit is a value falling between the first value and the second value.

8. The apparatus according to claim 1, further comprising a rear cover having an airspace between the rear cover and the rear surface of the display panel and configured to cover the rear surface of the display panel, wherein the airflow guide plate comes into contact with an inner surface of the rear cover at the second position.

9. The apparatus according to claim 1, wherein the heat radiating unit includes a heat radiating plate which is located on the rear surface side of the display panel so as to project into the airflow passage.

10. A display apparatus comprising:

a display panel; and a plurality of adjustment mechanisms respectively arranged for a plurality of areas on a rear surface of the display panel and configured to adjust a temperature of the display panel for each of the areas, each of the plurality of adjustment mechanisms including a heat radiating unit mounted on the rear surface of the display panel and configured to form an airflow passage including openings in a vertical direction, and an airflow passage changing unit configured to change a flow rate of an air flowing into the airflow passage through a lower opening by moving an airflow guide plate of the airflow passage changing unit between a first position to shut the airflow passage and a second position to open the airflow passage in a lower portion of the heat radiating unit, wherein the airflow passage changing unit decreases the flow rate of the air flowing into the airflow passage through the lower opening by moving the airflow guide plate from a second position side to a first position side when a temperature of an area of the plurality of areas on the rear surface of the display panel which corresponds to the heat radiating unit becomes not more than a predetermined value.

11. A display apparatus comprising:

a display panel; and a plurality of adjustment mechanisms respectively arranged for a plurality of areas on a rear surface of the display panel and configured to adjust a temperature of the display panel for each of the areas, each of the plurality of adjustment mechanisms including a heat radiating unit mounted on a rear surface of the display panel and configured to form an airflow passage including openings in a vertical direction, on the rear surface of the display panel, and an airflow passage changing unit configured to change a flow rate of an air flowing into the airflow passage through a lower opening in accordance with a temperature of an area of the plurality of areas on the rear surface of the display panel which corresponds to the heat radiating unit, wherein the airflow passage changing unit increases the flow rate of the air flowing into the airflow passage of the heat radiating unit through the lower opening when the temperature of the area on the rear surface of the display panel which corresponds to the heat radiating unit becomes not less than a predetermined value.

12. An adjustment mechanism which is arranged for each of a plurality of areas on a rear surface of a display panel and configured to adjust a temperature of the display panel for each of the areas, the mechanism comprising:

a heat radiating unit mounted on a rear surface of the display panel and configured to form an airflow passage including opening in a vertical direction, on the rear surface of the display panel; and an airflow passage changing unit configured to change a flow rate of an air flowing into the airflow passage of the heat radiating unit through a lower opening in accordance with a temperature of an area of the plurality of areas on the rear surface of the display panel which corresponds to the heat radiating unit,
wherein the airflow passage changing unit increases the flow rate of the air flowing into the airflow passage of the heat radiating unit through the lower opening when the temperature of the area on the rear surface of the display panel which corresponds to the heat radiating unit becomes not less than a predetermined value.

* * * * *